US012094623B2

(12) United States Patent
Wolk et al.

(10) Patent No.: US 12,094,623 B2
(45) Date of Patent: Sep. 17, 2024

(54) THIN ELECTRICALLY CONDUCTIVE FILM

(71) Applicant: Cambrios Film Solutions Corporation, Tortola (VG)

(72) Inventors: Jeff Alan Wolk, Half Moon Bay, CA (US); Michael Andrew Spaid, Mountain View, CA (US); Haixia Dai, Pleasanton, CA (US)

(73) Assignee: Cambrios Film Solutions Corporation, Tortola (VG)

( * ) Notice: Subject to any disclaimer, the term of this patent is extended or adjusted under 35 U.S.C. 154(b) by 424 days.

(21) Appl. No.: 17/600,765

(22) PCT Filed: Apr. 1, 2020

(86) PCT No.: PCT/US2020/026063
§ 371 (c)(1),
(2) Date: Oct. 1, 2021

(87) PCT Pub. No.: WO2020/205904
PCT Pub. Date: Oct. 8, 2020

(65) Prior Publication Data
US 2022/0172859 A1 Jun. 2, 2022

Related U.S. Application Data

(60) Provisional application No. 62/828,711, filed on Apr. 3, 2019.

(51) Int. Cl.
*H01B 1/02* (2006.01)
*H01B 1/22* (2006.01)
(Continued)

(52) U.S. Cl.
CPC .............. *H01B 1/22* (2013.01); *H01B 1/02* (2013.01); *H01B 5/14* (2013.01); *H05K 1/097* (2013.01);
(Continued)

(58) Field of Classification Search
CPC . B82Y 30/00; H01B 1/02; H01B 1/22; H01B 5/14; H05K 1/097; H05K 1/09; H05K 2201/0108
(Continued)

(56) References Cited

U.S. PATENT DOCUMENTS 9,150,746 B1  10/2015  Li et al.
2011/0024159 A1  2/2011  Allemand et al.
(Continued)

FOREIGN PATENT DOCUMENTS

TW  201440080 A  10/2014
TW  201726829 A  8/2017
(Continued)

OTHER PUBLICATIONS

Electron-Tunneling Modulation in Percolating-Net_1st part_Sreeprasad et al_1757-1763_Mar. 2013.*
(Continued)

Primary Examiner — Timothy J Thompson
Assistant Examiner — Guillermo J Egoavil
(74) Attorney, Agent, or Firm — Cooper Legal Group, LLC

(57) ABSTRACT

A transparent, electrically-conductive film and associated method of making the transparent, electrically-conductive film. The transparent, electrically-conductive film includes a substrate, a percolating network of nanostructures establishing electrical conductivity across a region of the substrate, and an overcoat matrix coated onto the substrate. The nanostructures have an average diameter value. The percolating network of nanostructures is located within the overcoat matrix. The overcoat matrix and the percolating network of nanostructures therein have an overall thickness that is less than four times the average diameter value of the nanostructures.

20 Claims, 4 Drawing Sheets

(51) Int. Cl.
  *H01B 5/14* (2006.01)
  *H05K 1/09* (2006.01)
  *B82Y 30/00* (2011.01)

(52) U.S. Cl.
  CPC ...... *B82Y 30/00* (2013.01); *H05K 2201/0108* (2013.01)

(58) Field of Classification Search
  USPC ....................................................... 174/126.1
  See application file for complete search history.

(56) References Cited

U.S. PATENT DOCUMENTS

| | | | |
|---|---|---|---|
| 2012/0024572 A1 | 2/2012 | Naoi et al. | |
| 2012/0196053 A1* | 8/2012 | Coull ....................... | H01B 1/02 |
| | | | 427/108 |
| 2013/0142987 A1* | 6/2013 | Wardle ..................... | B82B 1/00 |
| | | | 156/60 |
| 2015/0166342 A1* | 6/2015 | Liu ................. | H01L 31/035227 |
| | | | 977/773 |
| 2018/0247722 A1 | 8/2018 | Yang et al. | |

FOREIGN PATENT DOCUMENTS

| | | |
|---|---|---|
| WO | 2008046058 A2 | 4/2008 |
| WO | 2013148879 A2 | 10/2013 |

OTHER PUBLICATIONS

Electron-Tunneling Modulation in Percolating-Network_2nd part_ Sreeprasad et al_1-10_Apr. 2013.*
Grooved Nanowires_Tevis et al_2032-2040_Mar. 2012.*
Percolating Behavior of Nanoparticles_Zhang et al_23705-23715_ Oct. 2017.*
International Search Report and Written Opinion cited in PCT/ US20/26063 mailed Jun. 26, 2020, 16 pages.

* cited by examiner

THIN ELECTRICALLY CONDUCTIVE FILM

RELATED APPLICATION

This application claims priority to U.S. Provisional Application Ser. No. 62/828,711, titled "ELECTRICALLY CONDUCTIVE FILM" and filed on Apr. 3, 2019, which is incorporated herein by reference.

FIELD

This disclosure is related to thin transparent, electrically conductive films, and methods of forming thin transparent, electrically conductive films with improved electrostatic discharge protection.

BACKGROUND

Transparent conductors include optically-clear and electrically-conductive films such as those commonly used in touch-sensitive computer displays. Generally, conductive nanostructures connect with each other to form a percolating network having long-range interconnectivity. The percolating network is connected to electronic circuits of a computer, tablet, smart phone, or other computing device having a touch-sensitive display by cooperating with metal contacts. Since the metal contacts are opaque, they are typically hidden behind a bezel surrounding the touch-sensitive region of the display.

However, the quest to minimize the form factor of computing devices, particularly portable computing devices, necessitates the use of small bezels. To allow the metal contacts to remain hidden from view, which affords the display with an aesthetically-pleasing appearance, the metal contacts must likewise be formed as small as possible. As the surface area of the metal contacts decreases, the size of the interconnects between the percolating network of nanostructures and the metal contacts also decreases. The result is an increasing contact resistance exhibited by the small metal contacts, which can interfere with the conduction of signals between the percolating network of nanostructures and the electronic circuits.

Such films are also susceptible to damage from electrostatic discharge (ESD) events. The discharge of a high voltage into a network of nanostructures can lead to destruction of the nanostructures. The destruction is due to the heating which is associated with the high currents resulting from the discharge. Most damage to the conductive films from an ESD event occurs at locations where the electrical resistance is high. If the contact resistance is high, most of the damage to the conductive film will likely occur in the vicinity of the electrical contact. As electronic devices with conductive films become smaller in size, the metal contacts that serve as an interface between such films and electronic circuits are often the locations where the resistance is the highest.

SUMMARY

According to an aspect, the subject disclosure provides a transparent, electrically-conductive film that includes a substrate, a percolating network of nanostructures establishing electrical conductivity across a region of the substrate, and an overcoat matrix coated onto the percolating network of nanostructures on the substrate. The nanostructures have an average diameter value. The percolating network of nanostructures is located within the overcoat matrix. The overcoat matrix and the percolating network of nanostructures therein have an overall thickness that is less than four times the average diameter value of the nanostructures.

According to an aspect, the subject disclosure provides a method of making a transparent, electrically-conductive film. Provide a substrate. Provide a percolating network of nanostructures establishing electrical conductivity across a region of the substrate. The nanostructures have an average diameter value. Provide an overcoat matrix coated onto the percolating network of nanostructures on the substrate. The percolating network of nanostructures is located within the overcoat matrix. The overcoat matrix and the percolating network of nanostructures therein have an overall thickness that is less than four times the average diameter value of the nanostructures.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DESCRIPTION OF THE DRAWINGS

While the techniques presented herein may be embodied in alternative forms, the particular embodiments illustrated in the drawings are only a few examples that are supplemental of the description provided herein. These embodiments are not to be interpreted in a limiting manner, such as limiting the claims appended hereto.

The disclosed subject matter may take physical form in certain parts and arrangement of parts, embodiments of which will be described in detail in this specification and illustrated in the accompanying drawings which form a part hereof and wherein.

DETAILED DESCRIPTION

Figure 1:
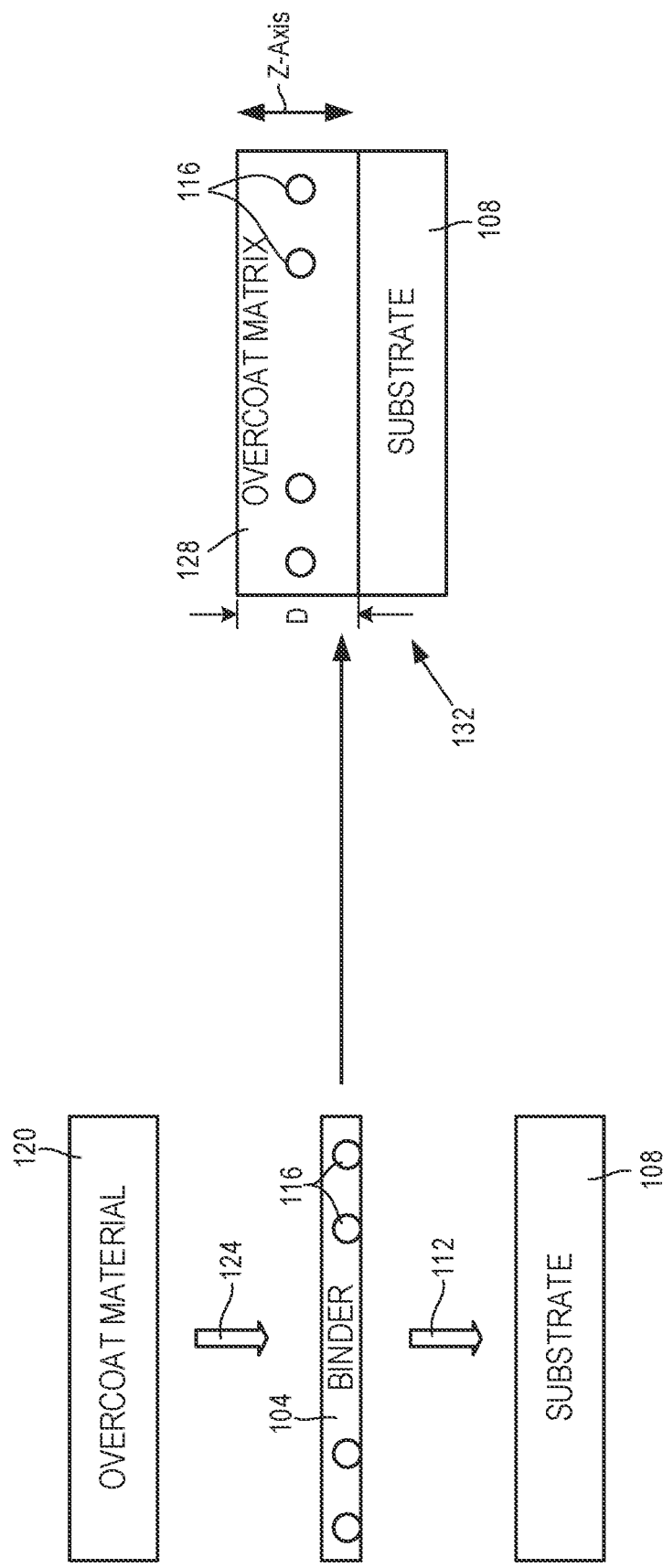
FIG. 1 is schematic cross section of an example transparent conductive film showing some example nanostructure in an example overcoat matrix, and also schematically shows an example method of making the transparent conductive film.

Subject matter will now be described more fully hereinafter with reference to the accompanying drawings, which form a part hereof, and which show, by way of illustration, specific example embodiments. This description is not intended as an extensive or detailed discussion of known concepts. Details that are known generally to those of ordinary skill in the relevant art may have been omitted, or may be handled in summary fashion.

Certain terminology is used herein for convenience only and is not to be taken as a limitation on the disclosed subject matter. Relative language used herein is best understood with reference to the drawings, in which like numerals are used to identify like or similar items. Further, in the drawings, certain features may be shown in somewhat schematic form.

The following subject matter may be embodied in a variety of different forms, such as methods, devices, components, and/or systems. Accordingly, this subject matter is not intended to be construed as limited to any illustrative embodiments set forth herein as examples. Rather, the embodiments are provided herein merely to be illustrative.

Provided herein is a transparent, electrically-conductive film that includes a substrate, a percolating network of nanostructures and an overcoat matrix. The percolating network of nanostructures establishes electrical conductivity across a region of the substrate. The nanostructures have an average diameter value. The overcoat matrix is coated onto the percolating network of nanostructures. The overcoat matrix has a thickness that is less than four times the average diameter value.

Also provided herein is a method of making a transparent, electrically-conductive film. The method includes providing a substrate and providing a percolating network of nanostructures such that the percolating network of nanostructures establishes electrical conductivity across a region of the substrate. The nanostructures have an average diameter value. The method includes providing an overcoat matrix to coat onto the percolating network of nanostructures. The overcoat matrix has a thickness that is less than four times the average diameter value.

It is to be appreciated that in order to protect the percolating nanostructure network, the overcoat layer is coated or otherwise applied onto the percolating nanostructure network. As stated above, the overcoat layer may have a thickness that may be related to nanostructure diameter. Within some examples, the thickness of the overcoat layer can be less than two nanostructure diameters. Still further, within some examples, the thickness of the overcoat layer can be within a range of one-three nanostructure diameters.

It is to be appreciated that for stated numeric diameter values of the nanostructures, the overcoat layer can be stated as numeric values/value ranges. As some examples, if the nanostructures have a diameter of 20 nm, the overcoat layer could have a thickness in the range of 20-80 nm. As some additional examples, if the nanostructures have a diameter of 20 nm, the overcoat matrix has a thickness that is less than 80 nm.

It is to be appreciated that there may be examples where there is no need to have such limit. The thickness of the overcoat can be affected by which overcoat is used, the solvent used in the silver paste, etc., and such aspects may provide for the variation of range limitation.

As used herein, "conductive nanostructures" or "nanostructures" generally refer to electrically conductive nano-sized structures, at least one dimension of which is less than 500 nm, or less than 250 nm, 100 nm, 50 nm, 25 nm, 15 nm, or 10 nm for example. Typically, the nanostructures are made of a metallic material, such as an elemental metal (e.g., transition metals) or a metal compound (e.g., metal oxide). The metallic material can also be a bimetallic material or a metal alloy, which comprises two or more types of metal. Suitable metals include, but are not limited to, silver, gold, copper, nickel, gold-plated silver, platinum and palladium.

The nanostructures can be of any shape or geometry. The morphology of a given nanostructure can be defined in a simplified fashion by its aspect ratio, which is the ratio of the length over the diameter of the nanostructure. For instance, certain nanostructures are isotropically shaped (i.e., aspect ratio=1). Typical isotropic nanostructures include nanoparticles. In preferred embodiments, the nanostructures are anisotropically shaped (i.e., aspect ratio≠1). The anisotropic nanostructure typically has a longitudinal axis along its length. Example anisotropic nanostructures include nanowires, nanorods, and nanotubes, as defined herein.

The nanostructures can be solid or hollow. Solid nanostructures include, for example, nanoparticles, nanorods and nanowires. Nanowires typically refers to long, thin nanostructures having aspect ratios of greater than 10, preferably greater than 50, and more preferably greater than 100. Typically, the nanowires are more than 500 nm, more than 1 µm, or more than 10 µm long. "Nanorods" are typically short and wide anistropic nanostructures that have aspect ratios of no more than 10. Although the present disclosure encompasses and is applicable to any type of nanostructure, for the sake of brevity, silver nanowires are presented as an example for discussion.

Turning to a consideration of some background, transparent, electrically-conductive films can be damaged by electrostatic discharge (ESD) events. The discharge of a high voltage into a network of nanowires can lead to destruction of the nanostructures. The destruction is due to the heating which is associated with the high currents resulting from the discharge. Contact resistance, denoted $R_c$, is the resistance between a contact material, e.g., silver paste, used to make contact to the rest of an electrical device and the conductive film. One of the areas which can be damaged in an ESD event is this contact area. The energy dissipated in any resistor is $E=I^2R\Delta t$, where I is the current through the resistor, R is the resistance, and $\Delta t$ is the time of the pulse. Therefore, the higher the resistance of this contact, the more likely it is that heating will take place there and melt nanostructures in that location. Another way to state this is that an ESD pulse has a certain energy which will be dissipated as heating of the nanowires. A higher contact resistance means that fewer nanowires are making contact to the silver paste electrical contact. Since the same energy will flow through fewer connections, those connections are more likely to melt.

Silver nanostructure films have a very different structure than traditional transparent conducting films such as those formed from indium tin oxide (ITO). ITO is extremely flat and covers the entire surface area of the conductive layer. By contrast, nanostructure films consist of a percolating network of conductive "sticks" (e.g., nanowires) and most of the area is actually space between the conductive elements. The interconnections between the nanostructures occur where the nanostructures intersect, and these intersections are higher above the substrate than other areas. The nanostructures are covered by a thin film, referred to herein as an overcoat, which serves the purpose of protecting the nanostructures from physical and environmental damage/degradation. Because of this unique geometry, which includes high points in the conductive network at nanostructure intersections, the ability to make electrical contact to the nanostructures is a sensitive function of the thickness of the overcoat layer. The thickness of the overcoat layer above the nanostructures can be limited to achieve a desired contact resistance less than a defined value.

With reference to FIG. 1, a nanostructure film (i.e., a device) 132 and methodology in accordance with at least an aspect of the present disclosure is schematically shown. A schematic cross section of an example transparent conductive film 132 (right side of FIG. 1), showing some example nanostructure 116 in an example overcoat matrix 128, is provided as a completed device on the right side of FIG. 1. Also, the left side of FIG. 1, with the schematic center arrow transitioning to the right side of FIG. 1 schematically presents an example method of making the transparent conductive film 132.

Within FIG. 1, a nanostructure, for example silver nanowire, layer 104/116 is coated 112 onto a plastic (e.g., polyethylene terephthalate (PET)) substrate 108. In an example, the nanostructure layer 104/116 can be referred to as an ink. The nanostructure layer 104/116 includes nanostructures 116 (e.g., silver nanowires) and a binder material 104 (left side of FIG. 1). The binder material 104 carries nanostructures 116 within the nanostructure layer 104/116.

Within the transparent conductive film 132, the nanostructures 116 connect to each other to form a percolating nanostructure network on the substrate 108. To protect the percolating nanostructure network, an electrically-insulating, overcoat material 120 (left side of FIG. 1) is coated 124 onto the nanostructure layer 104/116. In an example, the overcoat material 120 includes a polymer.

The overcoat material 120 and binder material 108 together form an overcoat matrix 128 (right side of FIG. 1) surrounding the nanostructures 116. The overall result is the film 132 that includes the substrate 108 and the percolating nanostructure network of nanostructures 116 within the overcoat matrix 128. However, it should be noted that it is possible to form the network without the use of a binder. Nonetheless, at least a portion of the overcoat matrix 128 is above the top of the nanostructures 116 that are in the percolating nanostructure network. The term "above" is with reference to a direction along a Z-axis away from the substrate 108. Within FIG. 1, the direction is up as viewed with FIG. 1, with the substrate 108 being located at the bottom.

A thickness D (right side of FIG. 1) of the matrix 128, which includes the nanostructures 116 in the percolating nanostructure network, is in the depth direction of the matrix 128, along the Z-axis in FIG. 1. The thickness D of the matrix 128, including the nanostructures 116 in the percolating nanostructure network, can be established to be less than or equal to an upper limit. The upper limit of the thickness D facilitates a low contact resistance between the film 132 and a metal contact electrically connected to an electronic circuit and affords improved protection of the nanostructures from damage attributable to ESD events.

The thickness D of the matrix 128 may exceed the upper limit for anomalies in the height of nanostructures within the percolating nanostructure network. However, an average of the thickness of the matrix 128 is less than or equal to the upper limit. In some examples, the overcoat layer may have a thickness that can be related to nanostructure diameter. Such nanostructure diameter can be presented to be an average nanostructure diameter. Such allows for some variation of individual nanostructure diameters.

Within some examples for the thickness D, the thickness of the overcoat layer can be: less than four nanostructure diameters, less than three nanostructure diameters, or within a range of one-three nanostructure diameters. As some examples, if the nanostructures have a diameter of 20 nm, the overcoat layer could have a thickness in the range of twenty to eighty (20-80) nanometers (nm). Example embodiments of the thickness D of the matrix 128 can have a thickness D that is no greater than eighty nanometers (80 nm), or no greater than sixty nanometers (60 nm), or no greater than fifty-five nanometers (55 nm), or no greater than fifty nanometers (50 nm), or no greater than forty-five nanometers (45 nm) nanometers, or no greater than forty nanometers (40 nm), or no greater than thirty-five nanometers (35 nm), or no greater than thirty nanometers (30 nm), for example. Some embodiments of the matrix 128 can have a thickness D that is at least twenty-five (25 nm) nanometers, or at least thirty (30 nm) nanometers, or at least thirty-five (35 nm) nanometers, for example.

A specific example embodiment of the matrix 128 can have a thickness D of at least thirty (30 nm) nanometers, up to eighty (80 nm) nanometers, for example. As specific example, the nanostructures have an average diameter of approximately 20 nm and the overcoat matrix 128 has a thickness D that is less than 80 nm. Of course, method(s) for making all of these various examples of the device of the film 132 are within the scope of this disclosure. Moreover, it is to be appreciated that different ranges are contemplated and thus not limited to the presented examples.

For an example, the overcoat material can include a solvent and the binder material 104 carrying the nanostructures 116 is at least partially soluble by the solvent. As an example, the nanostructures 116 can rise/ascend upward, along the Z-axis, within the overcoat matrix 128 to a final position that is above/higher than the position of the nanostructures possessed within the binder 104. Such upward rising/ascending of the nanostructures can be termed as upward float. For such example, the nanostructures 116 are thus positioned further from the substrate 108 and closer to a top of the film 132, along the Z-axis, to establish dimension of the thickness D.

As an example, the nanostructure layer 104/116 (e.g., the ink) can include, in addition to the nanostructures 116 and the binder 104, a solvent, a surfactant, and/or other additives. It is to be appreciated that specific materials present within the nanostructure layer 104/116 need not be specific limitation upon the present disclosure.

As an example of materials present within the nanostructure layer 104/116, a water-soluble polymer hydroxypropyl methylcellulose (HPMC) can be used as material of the binder 104. As an example, a non-polar or polar aprotic solvent such as propylene glycol methyl ether acetate (PG-MEA) and methyl ethyl ketone (MEK) can be used as a solvent to the overcoat material 120 (e.g., which includes a polymer). As an example, a polar protic solvent such as isopropyl alcohol (IPA) can be used as the solvent to the overcoat material 120. It is contemplated that some of such may only provide limited solubility regarding the binder material 104. It is to be appreciated that material(s) of the overcoat material 120 (e.g., which includes a polymer) is a factor regarding solubility thereof. Also, it is to be appreciated that amount of solvent present, or concentration, is a factor regarding solubility.

Following is some discussion about experimental analysis. Contact resistance, denoted $R_c$, is the resistance between a silver paste or other electrical contacting material used to make contact to the rest of an electrical device and the transparent, electrically-conductive film (e.g., 132) with the percolating nanostructure network. To demonstrate the sensitivity of $R_c$ on overcoat thickness D, a series of films were coated with nanostructure (with average diameter around 20 nm) networks having a sheet resistance $R_s$ of approximately 70 Ω/sq. The films were formed to have overcoat thicknesses (OC) D of 40, 60, and 80 nm, and were then laser patterned to create nanostructure lines that were 70, 100, 150 and 200 μm wide. Metal contacts were made for the films using silver paste with line widths of 100, 150 and 200 um, giving contact dimensions from roughly 0.007 mm2 to 0.04 mm². The Kelvin probe technique was used to measure the contact resistance $R_c$ of all the contacts.

Figure 2:
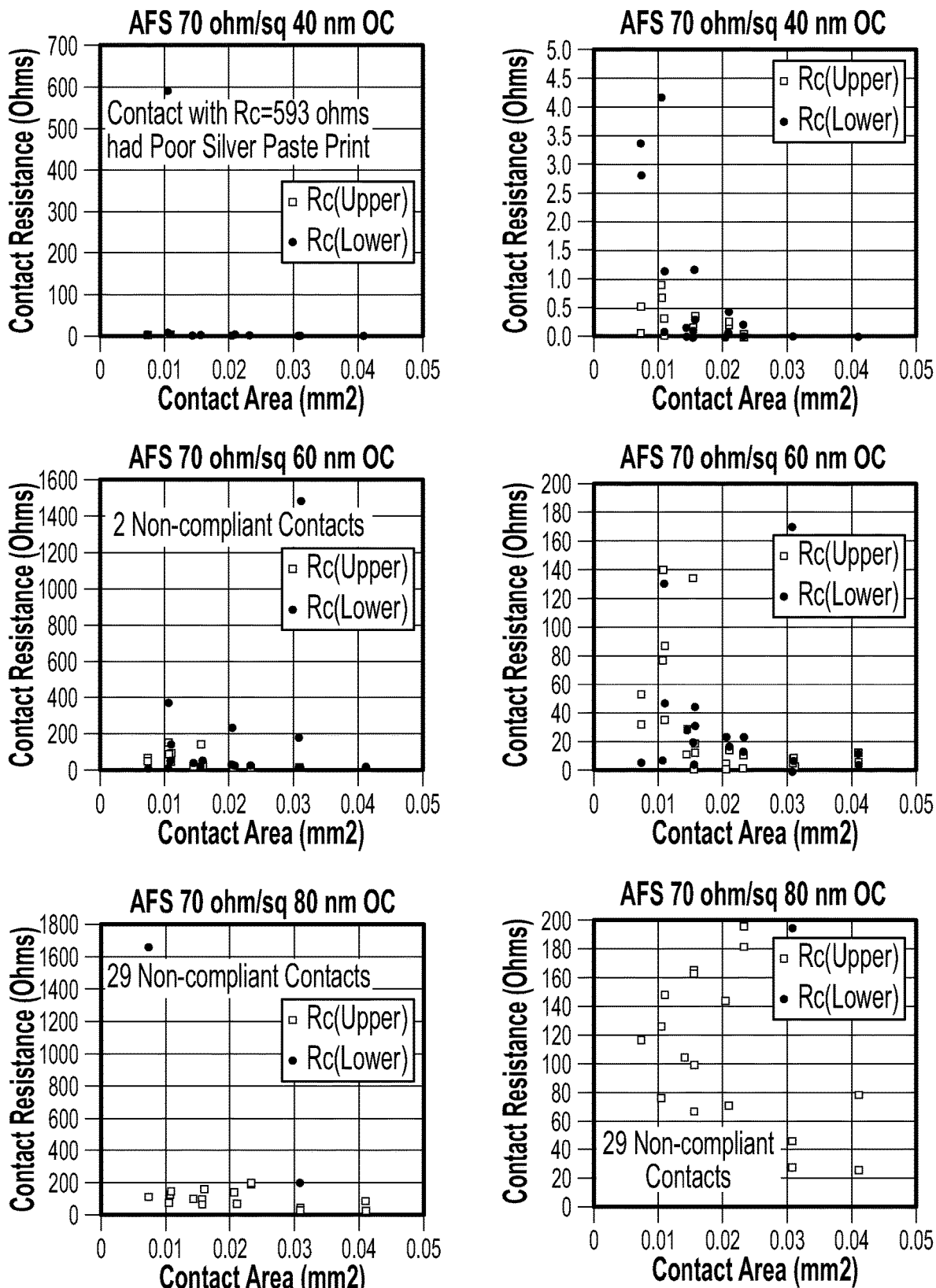
FIG. 2 shows experimental data of contact resistance determined for different overcoat matrix thicknesses.

FIG. 2 shows the results of the test measurements within a series of graph plots. Within FIG. 2, the top pair of graph plots is for the overcoat thickness D of 40 nm, the middle pair of graph plots is for the overcoat thickness D of 60 nm, and the bottom pair of graph plots is for the overcoat thickness D of 80 nm). For each film thickness (e.g., overcoat thickness D of 40 or 60 or 80 nm), the graph on the right has had the y-axis expanded to highlight contacts with lower $R_c$. There is no difference between the upper and lower contacts. A non-compliant contact means that the measurement current of 1 mA could not be put through the contact with 40 V applied (i.e., this is a very high resistance contact).

For the contacts on the film with 40 nm overcoat thickness D, all contacts measured had very low $R_c$ for all contact sizes above 0.03 mm$^2$, with $R_c$<0.5 ohms for contact areas greater than 0.02 mm$^2$ and no results above 5 ohms. Note that all of these contact resistances would be considered acceptable and very low relative to the typical total resistance of the patterned nanostructure lines. For the 60 nm contacts, much higher resistances are now seen for the smaller contacts, and contact resistances of up to close to 20 ohms are observed for even the largest contacts measured. The difference in scales from the graphs for the 40 nm overcoat data is noteworthy. Finally, for the 80 nm overcoat, a majority of the contacts were not compliant, implying they are very high resistance. Also, all the contacts which were compliant have a minimum of tens of ohms of contact resistance.

A test was conducted to determine whether ESD performance of nanostructure networks could be improved by a matrix 128 having a thickness D that is no greater than the upper limit described above. Limiting the matrix 128 thickness D decreases the contact resistance $R_c$ between the silver paste and the nanostructure network. Thus, the contact resistance has a lesser value than that which would result from a matrix 128 with a thickness D that is greater than the upper limit. It is to be appreciated that discussion of the test is only provided for information of showing viability of the present disclosure. As such the discussion of the test is not a limitation upon the present disclosure.

Figure 3:
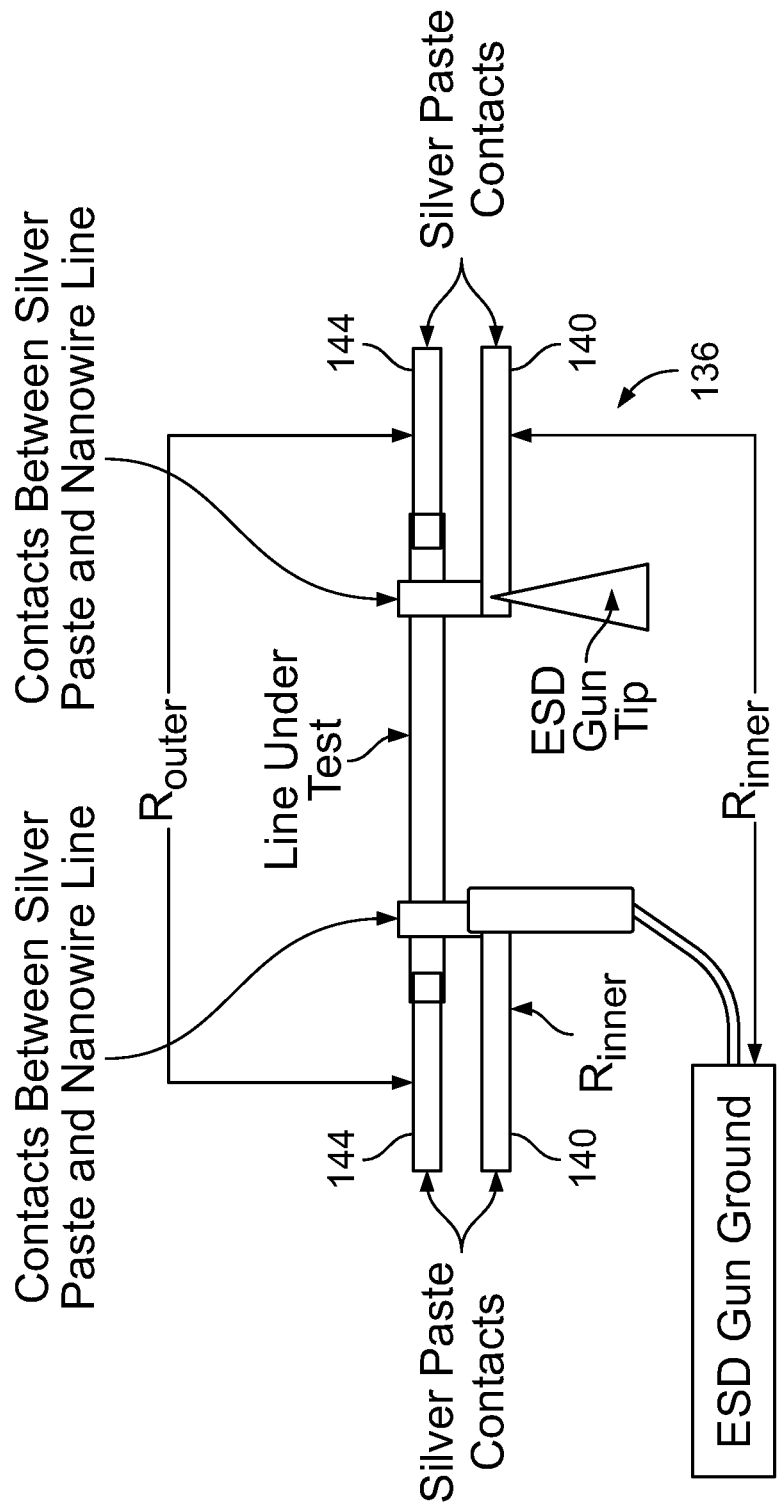
FIG. 3 shows an illustrative embodiment of a test geometry used to empirically measure failure voltages for different overcoat matrix thicknesses.

A test geometry is shown in FIG. 3. It is to be appreciated that the test geometry is not a limitation upon the present disclosure. According to the test geometry depicted in FIG. 3, an ESD Gun 136 was used to apply voltages across two inner contacts 140. The resulting current pulse was recorded using a Fisher F-65 current monitor probe attached to an oscilloscope. This pulse recording was then used to calculate the energy of the ESD pulse. The energy is proportional to the square of the voltage, so the failure voltages only are reported below. The failure voltage is considered to be the voltage at which the measured resistance of the nanowire line between the inner contacts 140 has increased by more than 100%.

One advantage of this technique is that the ESD pulse was applied on the inner contacts 140, and the line resistance between both the inner contacts 140 and the outer contacts 144 could be measured. If the change in the resistance between the inner contacts 140 is larger than the change in resistance between the outer contacts 144, then the contact is failing and there is NOT extensive ESD damage along the nanostructure line. Accordingly, it could not only be determined whether an ESD event has damaged the line, but it could also be determined whether a failure occurred at the contact.

Figure 4:
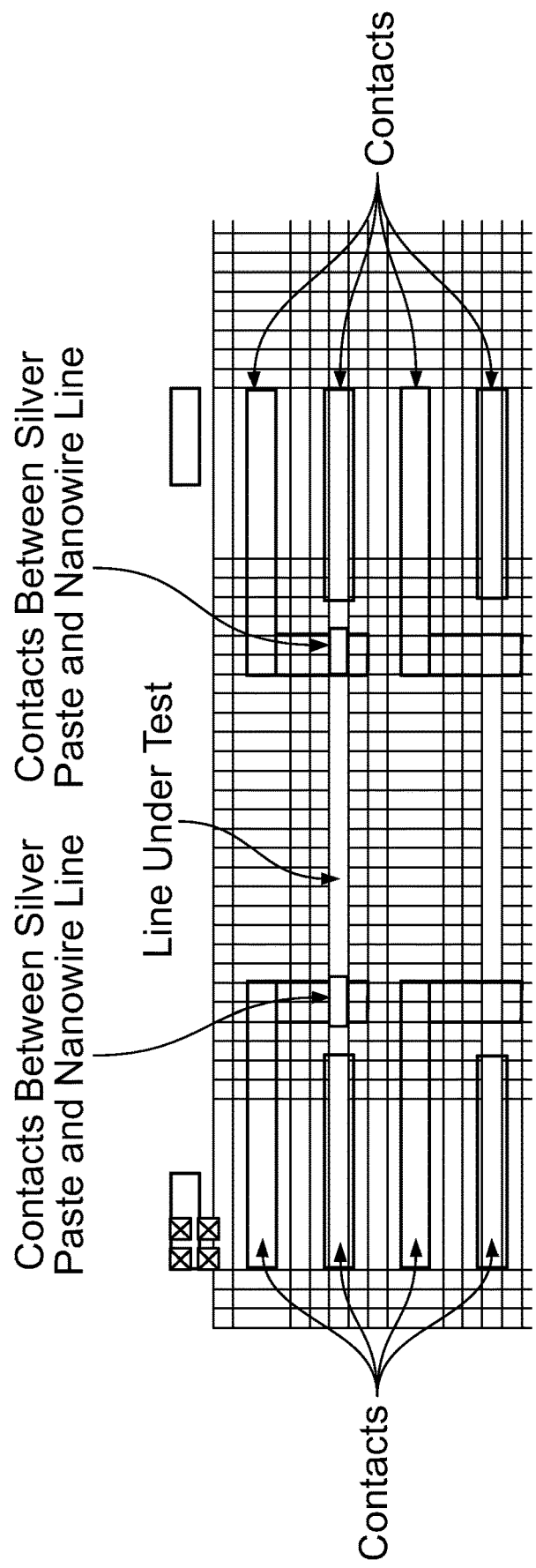
FIG. 4 shows a test film that has been laser patterned and provided with contacts.

As shown in FIG. 4, the percolating nanostructure network was laser patterned according to the cross-hatched lines. Here also, this network is provided in connection with discussion of the test and is not a limitation upon the present disclosure. Contacts, as represented by the boxed areas were put on after patterning. The nanostructure lines and the silver paste lines were both 1 mm in width.

ESD testing was performed on 50 Ω/square nanostructure (with average diameter around 20 nm) films with different matrix 128 thicknesses D, ranging from 60 to 98 nm. The failure voltages observed for the four films tested are tabulated in Table 1, below. It was determined from the measurements that the 60 nm thick matrix 128 did not fail at the contacts, but that all of the other thickness films did fail at the contact. The contact resistance for these lines was also measured prior to the measurement of the failure voltage, and it was found that the matrix 128 material having a 60 nm thickness D also exhibited the lowest contact resistance, while the thickest matrix thickness D (98 nm) had the highest contact resistance of the tested films.

TABLE 1

MEASURE FAILURE VOLTAGES FOR FILM THICKNESSES

| Film | Overcoat matrix thickness (nm) | Failure Voltage (V) |
|---|---|---|
| 160-24 | 60 | 1900 |
| 160-25 | 73 | 1350 |
| 160-26 | 84 | 300 |
| 160-27 | 98 | 200 |

Contact resistance, denoted $R_c$, is the resistance between the silver paste used to make contact to the rest of an electrical device and the transparent, electrically-conductive film with the percolating nanostructure network.

The experimental procedures described above were repeated on nanostructure films with matrix 128 thicknesses D of 40, 60, and 80 nm, and very similar results were obtained. Since energy dissipated is a function of the square of the voltage, it was determined that the energy dissipation dependence is a very sensitive function of thickness.

It is to be appreciated that although the testing geometry used can be considered to be is very instructive, such may not be typical. In more typical testing geometries, the samples could survive much higher voltage discharges as compared to the current testing geometry. Therefore, the example failure voltage of 1350 V could seem to be low. It is to be appreciated that such may be considered to only be an artifact of the extremely severe testing conditions associated with the testing geometry. It is to be appreciated that within FIGS. 3 and 4, the contact of interest is shown. Such is simply for testing and is not a limitation upon the present disclosure. The content of the present disclosure can be utilized within a variety of film structures and thus a variety of devices that use such film structures.

Turning back to the structural properties of the film 132 of and provided by the present disclosure, an additional property is that the thickness of the overcoat matrix can be sufficient to establish a failure voltage of at least 1350 V for a film sheet resistance of 50 ohm/sq or higher. Such is shown by the above-discussed test. So, the present disclosure provides such a film 132. Moreover, when the method of making the film 132 is performed, the method is to make a film in which the thickness of the overcoat matrix can be sufficient to establish a failure voltage of at least 1350 V for a film sheet resistance of 50 ohm/sq or higher.

Unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "example," "illustrative embodiment," are used herein to mean serving as an instance, illustration, etc., and not necessarily as advantageous. As used herein, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", and/or variants thereof are used in either the detailed description or the claims, such terms are intended to be inclusive in a manner similar to the term "comprising".

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments and/or examples are provided herein. The order in which some or all of the operations are described herein should not be construed as to imply that these operations are necessarily order dependent. Alternative ordering will be appreciated by one skilled in the art having the benefit of this description. Further, it will be understood that not all operations are necessarily present in each embodiment and/or example provided herein. Also, it will be understood that not all operations are necessary in some embodiments and/or examples.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A transparent, electrically-conductive film comprising:
    a substrate;
    a percolating network of nanostructures establishing electrical conductivity across a region of the substrate, the nanostructures having an average diameter value; and
    an overcoat matrix coated onto the substrate, the percolating network of nanostructures located within the overcoat matrix, the overcoat matrix and the percolating network of nanostructures therein having an overall thickness that is less than four times the average diameter value of the nanostructures,
    wherein the overall thickness of the overcoat matrix and the percolating network of nanostructures is in a range of 40 to 80 nanometers, and
    wherein the overall thickness of the overcoat matrix and the percolating network of nanostructures is sufficient to establish a failure voltage of at least 1350 V for a film sheet resistance of 50 ohm/sq or higher.

2. The transparent, electrically-conductive film of claim 1, wherein the overall thickness of the overcoat matrix and the percolating network of nanostructures is less than two times the average diameter value.

3. The transparent, electrically-conductive film of claim 1, wherein the average diameter value is approximately 20 nm.

4. The transparent, electrically-conductive film of claim 3, wherein the overcoat matrix is from a binder material carrying the nanostructures and an overcoat material, and the overcoat material includes a solvent and the binder material carrying the nanostructures is at least partially soluble by the solvent.

5. The transparent, electrically-conductive film of claim 1, wherein the overall thickness of the overcoat matrix and the percolating network of nanostructures is sufficient to establish a contact resistance of less than 150 Ohms between the percolating network of nanostructures and a metal contact having a contact area of approximately one one-hundredth square millimeters (0.01 mm$^2$) or larger.

6. The transparent, electrically-conductive film of claim 1, wherein the overcoat matrix is from a binder material carrying the nanostructures and an overcoat material.

7. The transparent, electrically-conductive film of claim 6, wherein the overcoat material includes a solvent and the binder material carrying the nanostructures is at least partially soluble by the solvent.

8. The transparent, electrically-conductive film of claim 7, wherein the overcoat matrix includes a resultant of materials from the binder material and the overcoat material.

9. A method of making a transparent, electrically-conductive film, the method comprising:
    providing a substrate;
    providing a percolating network of nanostructures establishing electrical conductivity across a region of the substrate, the nanostructures having an average diameter value; and
    providing an overcoat matrix coated onto the substrate, the percolating network of nanostructures being located within the overcoat matrix, the overcoat matrix and the percolating network of nanostructures therein having an overall thickness that is less than four times the average diameter value of the nanostructures,
    wherein the overall thickness of the overcoat matrix and the percolating network of nanostructures is in a range of 40 to 80 nanometers, and
    wherein the step of providing an overcoat matrix is such that the overcoat matrix and the percolating network of nanostructures is sufficient to establish a failure voltage of at least 1350 V for a film sheet resistance of 50 ohm/sq or higher.

10. The method of claim 9, wherein the step of providing an overcoat matrix is such that the overall thickness of the overcoat matrix and the percolating network of nanostructures is less than two times the average diameter value.

11. The method of claim 9, wherein the step of providing an overcoat matrix is such that the average diameter value is approximately 20 nm.

12. The method of claim 11, wherein the step of providing an overcoat matrix is such that the overcoat matrix is from a binder material carrying the nanostructures and an overcoat material, and the overcoat material includes a solvent and the binder material carrying the nanostructures is at least partially soluble by the solvent.

13. The method of claim 9, wherein the step of providing an overcoat matrix is such that the overall thickness of the overcoat matrix and the percolating network of nanostructures is sufficient to establish a contact resistance of less than 150 Ohms between the percolating network of nanostructures and a metal contact having a contact area of approximately one one-hundredth square millimeters (0.01 mm$^2$) or larger.

14. The method of claim 9, wherein the step of providing an overcoat matrix is such that the overcoat matrix is from a binder material carrying the nanostructures and an overcoat material.

15. The method of claim 14, wherein the step of providing an overcoat matrix is such that the overcoat material includes a solvent and the binder material carrying the nanostructures is at least partially soluble by the solvent.

16. The method of claim 15, wherein the step of providing an overcoat matrix is such that the overcoat matrix includes a resultant of materials from the binder material and the overcoat material.

17. A transparent, electrically-conductive film comprising:
  a substrate;
  a percolating network of nanostructures establishing electrical conductivity across a region of the substrate, the nanostructures having an average diameter value; and
  an overcoat matrix coated onto the substrate, the percolating network of nanostructures located within the overcoat matrix, the overcoat matrix and the percolating network of nanostructures therein having an overall thickness that is less than four times the average diameter value of the nanostructures,
  wherein the average diameter value is approximately 20 nm and the overall thickness of the overcoat matrix and the percolating network of nanostructures is less than 80 nm, and
  wherein the overall thickness of the overcoat matrix and the percolating network of nanostructures is sufficient to establish a failure voltage of at least 1350 V for a film sheet resistance of 50 ohm/sq or higher.

18. The transparent, electrically-conductive film of claim 17, wherein the overcoat matrix is from a binder material carrying the nanostructures and an overcoat material, and the overcoat material includes a solvent and the binder material carrying the nanostructures is at least partially soluble by the solvent.

19. The transparent, electrically-conductive film of claim 17, wherein the overall thickness of the overcoat matrix and the percolating network of nanostructures is less than two times the average diameter value.

20. The transparent, electrically-conductive film of claim 17, wherein the overall thickness of the overcoat matrix and the percolating network of nanostructures is sufficient to establish a contact resistance of less than 150 Ohms between the percolating network of nanostructures and a metal contact having a contact area of approximately one one-hundredth square millimeters (0.01 mm$^2$) or larger.

* * * * *